(12) United States Patent
Raval et al.

(10) Patent No.: US 8,693,271 B2
(45) Date of Patent: Apr. 8, 2014

(54) METHOD OF STRESSING STATIC RANDOM ACCESS MEMORIES FOR PASS TRANSISTOR DEFECTS

(75) Inventors: Jayesh C. Raval, Allen, TX (US); Beena Pious, Carrollton, TX (US); Stanton Petree Ashburn, McKinney, TX (US); James Craig Ondrusek, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 269 days.

(21) Appl. No.: 13/370,451

(22) Filed: Feb. 10, 2012

(65) Prior Publication Data

US 2013/0039139 A1 Feb. 14, 2013

Related U.S. Application Data

(60) Provisional application No. 61/522,004, filed on Aug. 10, 2011.

(51) Int. Cl.
| | |
|---|---|
| *G11C 29/00* | (2006.01) |
| *G11C 7/00* | (2006.01) |
| *G11C 29/50* | (2006.01) |
| *G11C 29/08* | (2006.01) |
| *G11C 11/41* | (2006.01) |
| *G11C 11/419* | (2006.01) |

(52) U.S. Cl.
CPC ............. *G11C 29/00* (2013.01); *G11C 29/50* (2013.01); *G11C 29/08* (2013.01); *G11C 11/41* (2013.01); *G11C 11/419* (2013.01)
USPC .......................................... 365/201; 365/154

(58) Field of Classification Search
CPC ........ G11C 29/00; G11C 29/08; G11C 29/50; G11C 11/41; G11C 11/419
USPC .................................. 365/201, 154, 189.14
See application file for complete search history.

(56) References Cited

U.S. PATENT DOCUMENTS

| | | | |
|---|---|---|---|
| 7,088,607 B2 | 8/2006 | Matsuzawa et al. | |
| 8,488,369 B2 * | 7/2013 | Chandra et al. | 365/154 |
| 2010/0110807 A1 * | 5/2010 | Pious et al. | 365/194 |
| 2010/0296329 A1 * | 11/2010 | Summerfelt et al. | 365/145 |
| 2011/0299349 A1 * | 12/2011 | Deng et al. | 365/201 |

OTHER PUBLICATIONS

Guo et al., "Large-Scale Read/Write Margin Measurement in 45nm CMOS SRAM Arrays", Digest of Tech. Papers, 2008 Symp. on VLSI Circuits (IEEE, 2008), pp. 42-43.
U.S. Appl. No. 13/220,104, filed Aug. 29, 2011, and entitled "Method of Screening Static Random Access Memories for Pass Transistor Defects".

* cited by examiner

*Primary Examiner* — Toan Le
(74) *Attorney, Agent, or Firm* — Rose Alyssa Keagy; Wade J. Brady, III; Frederick J. Telecky, Jr.

(57) ABSTRACT

A method of stressing and screening static random access memory (SRAM) arrays to identify memory cells with bit line side pass transistor defects. After writing initial data states into the memory array under nominal bias conditions, an elevated bias voltage is applied to the memory array, for example to its power supply node. Under the elevated bias voltage, alternating data patterns are written into and read from the memory array for a selected duration. The elevated bias voltage is reduced, and a write screen is performed to identify defective memory cells. The dynamic stress of the repeated writes and reads accelerates early life failures, facilitating the write screen.

19 Claims, 8 Drawing Sheets

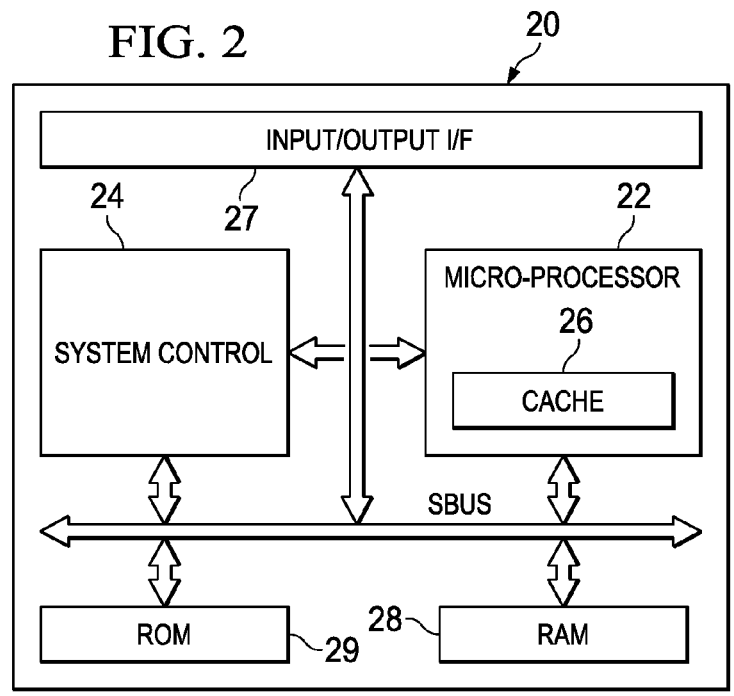
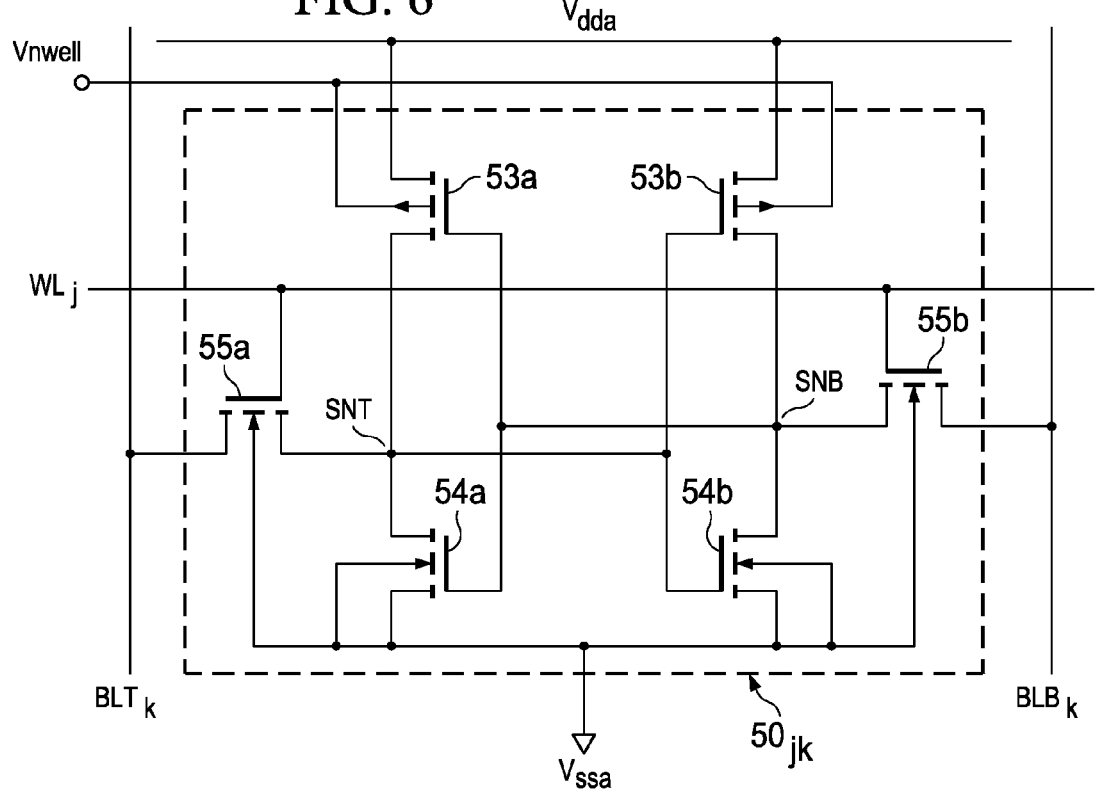

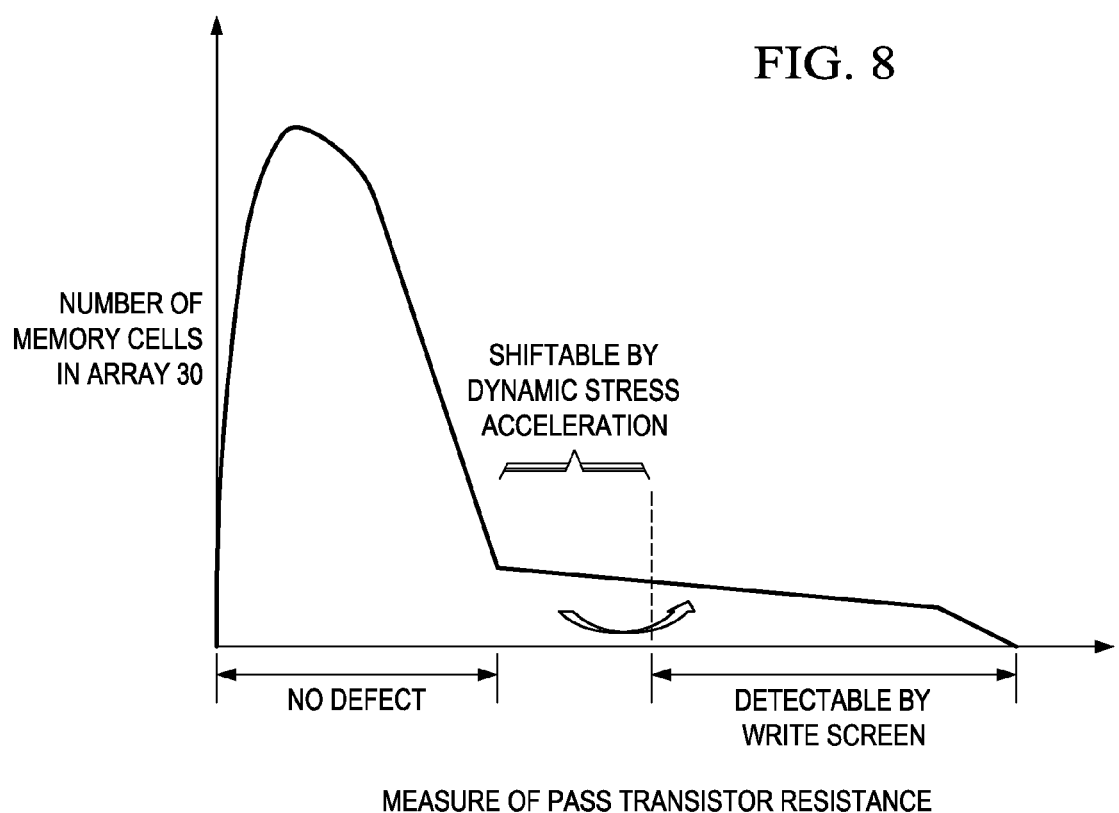

METHOD OF STRESSING STATIC RANDOM ACCESS MEMORIES FOR PASS TRANSISTOR DEFECTS

CROSS-REFERENCE TO RELATED APPLICATIONS

This application claims priority, under 35 U.S.C. §119(e), of Provisional Application No. 61/522,004, filed Aug. 10, 2011, which is incorporated herein by reference.

STATEMENT REGARDING FEDERALLY SPONSORED RESEARCH OR DEVELOPMENT

Not applicable.

BACKGROUND OF THE INVENTION

This invention is in the field of solid-state memory. Embodiments of this invention are more specifically directed to the manufacture and testing of static random access memories (SRAMs).

Many modern electronic devices and systems now include substantial computational capability for controlling and managing a wide range of functions and useful applications. The computational power of these modern devices and systems is typically provided by one or more processor "cores". These processor cores operate as a digital computer, in general retrieving executable instructions from memory, performing arithmetic and logical operations on digital data retrieved from memory, and storing the results of those operations in memory. Other input and output functions for acquiring and outputting the data processed by the processor cores are performed as appropriate. Considering the large amount of digital data often involved in performing the complex functions of these modern devices, significant solid-state memory capacity is now commonly implemented in the electronic circuitry for these systems.

Static random access memory (SRAM) has become the memory technology of choice for much of the solid-state data storage requirements in modern power-conscious electronic systems. As is fundamental in the art, SRAM cells store contents "statically", in that the stored data state remains latched in each cell so long as power is applied to the memory; this is in contrast to "dynamic" RAM ("DRAM"), in which the data must be periodically refreshed in order to be retained.

An example of a conventional SRAM cell is shown in FIG. 1a. In this example, SRAM cell 2 is a conventional six-transistor (6-T) static memory cell 2, which in this case is in the $j^{th}$ row and $k^{th}$ column of a memory array. SRAM memory cell 2 is biased between the voltage on power supply line $V_{dda}$ and a ground reference voltage $V_{ssa}$. SRAM memory cell 2 is constructed in the conventional manner as a pair of cross-coupled CMOS inverters, one inverter of series-connected p-channel MOS load transistor 3a and n-channel MOS driver transistor 4a, and the other inverter of series-connected p-channel MOS load transistor 3b and n-channel MOS transistor 4b; the gates of the transistors in each inverter are connected together and to the common drain node of the transistors in the other inverter, in the usual manner. The common drain node of transistors 3a, 4a constitutes storage node SNT, and the common drain node of transistors 3b, 4b constitutes storage node SNB, in this example. N-channel MOS pass-gate transistor 5a has its source/drain path connected between storage node SNT and bit line $BLT_k$ for the $k^{th}$ column, and n-channel MOS pass-gate transistor 5b has its source/drain path connected between storage node SNB and bit line $BLB_k$. The gates of pass-gate transistors 5a, 5b are driven by word line $WL_j$ for this $j^{th}$ row in which cell 2 resides.

The body nodes of p-channel transistors 3a, 3b are typically connected to power supply voltage $V_{dda}$ (by way of an n-well connection), and the body nodes of n-channel transistors 4a, 4b, 5a, 5b are typically connected to ground voltage $V_{ssa}$ (by way of a p-well connection). This condition, in which the voltage difference between the body nodes and source nodes of the transistors in memory cell 2 is zero, is commonly referred to as the "zero back-bias" or "normal back-bias" condition.

In operation, bit lines $BLT_k$, $BLB_k$ are typically precharged to a high voltage (at or near power supply voltage $V_{dda}$), and are equalized to the same voltage. To access cell 2 for a read operation, word line $WL_j$ is then energized, turning on pass-gate transistors 5a, 5b, and connecting storage nodes SNT, SNB to bit lines $BLT_k$, $BLB_k$. The differential voltage developed on bit lines $BLT_k$, $BLB_k$ is then sensed and amplified by a sense amplifier. In a write operation, typical modern SRAM memories include write circuitry that pulls one of bit lines $BLT_k$, $BLB_k$ low (i.e., to a voltage at or near ground voltage $V_{ssa}$), depending on the data state to be written. Upon word line $WL_j$ then being energized, the low level bit line $BLT_k$ or $BLB_k$ will pull down its associated storage node SNT, SNB, causing the cross-coupled inverters of addressed cell 2 to latch in the desired state.

Advances in semiconductor technology in recent years have enabled the shrinking of minimum device feature sizes (e.g., MOS transistor gates) into the sub-micron range. This miniaturization is especially beneficial when applied to memory arrays, because of the large proportion of the overall chip area often devoted to on-chip memories. As a result, significant memory resources are now often integrated as embedded memory into larger-scale integrated circuits, such as microprocessors, digital signal processors, and "system-on-a-chip" integrated circuits. However, this physical scaling of device sizes raises significant issues, especially in connection with embedded SRAM but also in SRAM realized as "stand-alone" memory integrated circuit devices. Several of these issues are due to increased variability in the electrical characteristics of transistors formed at these extremely small feature sizes. This variability in characteristics has been observed to increase the likelihood of read and write functional failures, on a cell-to-cell basis. Sensitivity to device variability is especially high in those memories that are at or near their circuit design limits. The combination of increased device variability with the larger number of memory cells (and thus transistors) within an integrated circuit renders a high likelihood that one or more cells cannot be read or written as expected.

One type of SRAM functional failure is referred to as a cell stability failure. In general, a cell stability failure occurs if noise of sufficient magnitude couples to the bit lines of unselected cells, for example during a write to a selected memory cell in the same row, to cause a false write of data to unselected cells in that same row. In effect, such write cycle noise can be of sufficient magnitude as to trip the inverters of one or more of the unselected cells (i.e., the "half-selected" cells in unselected columns of the selected row). The possibility of such a cell stability failure is exacerbated by device mismatch and variability, as discussed above.

Write failures are the converse of cell stability failures—while a cell stability failure occurs if a cell changes its state too easily, a write failure occurs if an addressed cell is stubborn to being written with the opposite data state. In general, write failures are due to the inability of write circuitry to pull down the storage node currently latched to a high voltage. For example, if cell 2 is storing a "1" state (its load transistor 3a on, and driver transistor 4a off), an attempt to write a low logic level to storage node SNT will fail if bit line $BLT_k$ is unable to sufficiently discharge storage node SNT to a sufficient level to trip the inverters. As such, SRAM write failures occur if the drive of the pass transistor is sufficiently weak, relative to the drive of the p-channel load transistor pulling up the storage node to be written.

Conventional manufacturing tests of SRAMs include various tests of the writeability of each memory cell. These writeability tests amount to the writing of both data states "0" and "1" over the previously stored opposite data states, followed by reads of the newly written data state, under one or more bias conditions intended to screen out those SRAM cells with weak "write margin". Conventional write margin measurements include sweeping the low side bit line voltage above ground; sweeping the word line voltage below the power supply voltage $V_{dda}$; measuring the write current on the low side bit line; and characterizing the write noise margin corresponding to the well-known "butterfly" curve. Manufacturing test conditions are typically derived based on these measurements for each particular SRAM design, and can include some sort of "guardband" in which one or more of the relevant operating voltages is set at a harsher voltage than in normal operation (e.g., low side bit line voltage during write may be held at a selected voltage above ground), thus screening out those SRAM cells with weak write margin. Those weak cells may be replaced by conventional redundancy techniques, or the memory itself may be considered as failed.

Accelerated operating life test of certain integrated circuits have exhibited early life failures appearing as write failures to one or more SRAM cells. These SRAM cells had previously successfully passed the conventional write margin screening. Failure analysis indicated that many of these write failure cells exhibit manufacturing defects on the "bit line side" of the pass transistors, resulting in asymmetry in those cells. One particular type of defect causing such failures appeared as a missing lightly-doped drain extension on that side of the transistor; other manufacturing defects were similarly observed as causing such asymmetry.

FIG. 1b illustrates an example of the electrical effect of such a bit line side defect in an instance of SRAM cell 2. In this example, pass transistor 5a, coupled between storage node SNT and bit line $BLT_k$ exhibits this type of defect, for example as corresponding to a missing drain extension on the side of pass transistor 5a electrically closest to bit line $BLT_k$. In that case, as in the case of other similarly-behaving defects, the conduction path between the channel of transistor 5a (when on) and bit line $BLT_k$ is more resistive than normal, as exhibited by resistor $5R_{ds}$ in FIG. 1b. It has been observed, in connection with this invention, that the effective resistance of resistor $5R_{ds}$ can be on the order of 10 to 50 kΩ. This resistance reduces the ability of bit line $BLT_k$ and pass transistor 5a to pull storage node SNT sufficiently low to trip the state of the cell.

Because of the bit line side location of this defect, conventional manufacturing "time zero" screens have not effectively screened out these marginal cells. However, it has been observed that even modest degradation of the cell transistors in accelerated operating life test (or burn-in, as the case may be) shifts the write performance enough to cause early life write failures in a number of devices. It is believed that the degradation mechanism resulting in these failures is channel hot carrier shifts.

By way of further background, conventional manufacturing test flows, for example as applied to solid-state SRAM arrays in wafer form, may include a static stress to accelerate early life defects. FIG. 1c illustrates an example of such a conventional test flow as applied to the SRAM array under test, beginning with process 10 in which conventional DC tests (e.g., leakage, power dissipation, etc.) are performed. Assuming the SRAM array meets the DC requirements, a checkerboard data pattern (i.e., alternating "0" and "1" data states) is selected in process 11, and is written into the SRAM array under test, with the power supply voltage $V_{dda}$ applied to the memory cells set at a nominal level (e.g., 1.2 volts), in process 12. With the checkerboard pattern written into the SRAM array, power supply voltage $V_{dda}$ as applied to the memory cells is increased to a stress level (e.g., 1.8 volts), in process 13. This stress bias level is applied to the memory cells in the SRAM array under test for a selected duration, in process 14; for example, this static stress duration may be on the order of three seconds. Following the static stress of process 14, power supply voltage $V_{dda}$ is lowered to its nominal level in process 15. After this first stress with the checkerboard pattern written (as determined by decision 16 indicating "no"), an inverse checkerboard pattern (i.e., the opposite data state for each memory cell in the SRAM array under test, as compared with the checkerboard pattern) is selected in process 17, and written into the SRAM array at nominal $V_{dda}$ in process 12. The SRAM array is again stressed with this inverse data pattern in processes 13 and 14.

After return to nominal bias in process 15 following the static stress applied in both data states (decision 16 indicating "yes"), a write screen test is performed on the SRAM array under test in process 18a, for example by way of one or more writeability tests under bias conditions intended to screen out those SRAM cells with weak "write margin", perhaps including a "guardband" in which one or more of the relevant operating voltages is set at a harsher voltage than in normal operation (e.g., low side bit line voltage during write may be held at a selected voltage above ground). If the entire SRAM array under test passes the write screen test, as determined by pass/fail decision 18b, the device moves on to additional testing as desired. If one or a few (less than some limit n) memory cells in the SRAM array fail the write screen test after static stress, those weak cells may be replaced by conventional redundancy techniques and retested by way of the write screen test in process 19a; if decision 18b determines that more cells failed than can be repaired by redundancy, the SRAM array is considered to have failed. Decision 19b determines whether all memory cells in the SRAM array, following repair, have now passed the write screen test, and identifies the SRAM array as either passing or failing as a result.

BRIEF SUMMARY OF THE INVENTION

Embodiments of this invention provide a method of stressing and screening integrated circuits including memory arrays, at manufacture, to identify memory cells and arrays that are vulnerable to early life write failures.

Embodiments of this invention provide such a method that efficiently distinguishes the vulnerable cells from good memory cells, without the yield loss due to over-screening.

Embodiments of this invention provide such a method that enables the use of redundancy techniques to replace memory cells identified as vulnerable to early life failure.

Other advantages of embodiments of this invention will be apparent to those of ordinary skill in the art having reference to the following specification together with its drawings.

Embodiments of this invention may be implemented into an automated test program or sequence, for testing a population of CMOS memory cells constructed as cross-coupled inverters. Functionality of the memory cells is confirmed by conventional functional testing under normal operating conditions, as may be guardbanded. A known data state is then written to each memory cell in the population under nominal bias conditions. Bias at a stress level is then applied, and alternating data states are written and read from the memory cells in the population under this stress bias level, for a selected duration. Nominal bias level is applied again, followed by post-stress write screen tests on the population of memory cells to identify those cells for which defects were accelerated by the dynamic stress.

According to another aspect of the invention, this dynamic stress is followed by a write screen test in which the back-bias of load transistors in the cross-coupled inverters is modulated to a forward back-bias condition for writing of opposite states is then performed under this bias, followed by reads of the written data state under normal bias (or still under forward back-bias, if reads are not affected by that bias condition). The sequence is repeated for the opposite data state. Memory cells identified as failing the write test under forward back-bias can then be replaced by enabling redundant rows or columns, if available.

BRIEF DESCRIPTION OF THE SEVERAL VIEWS OF THE DRAWING

FIG. 2 is an electrical diagram, in block form, of a large-scale integrated circuit in which memory resources are implemented, and to which embodiments of the invention are applied.

FIG. 6 is an electrical diagram, in schematic form, of an SRAM cell in the memory of FIG. 3, illustrating a body node bias connection as used in a write screen according to an embodiment of the invention.

FIG. 8 is a plot of memory cell population versus pass transistor resistance, illustrating the operation of embodiments of the invention.

DETAILED DESCRIPTION OF THE INVENTION

Figure 1A:
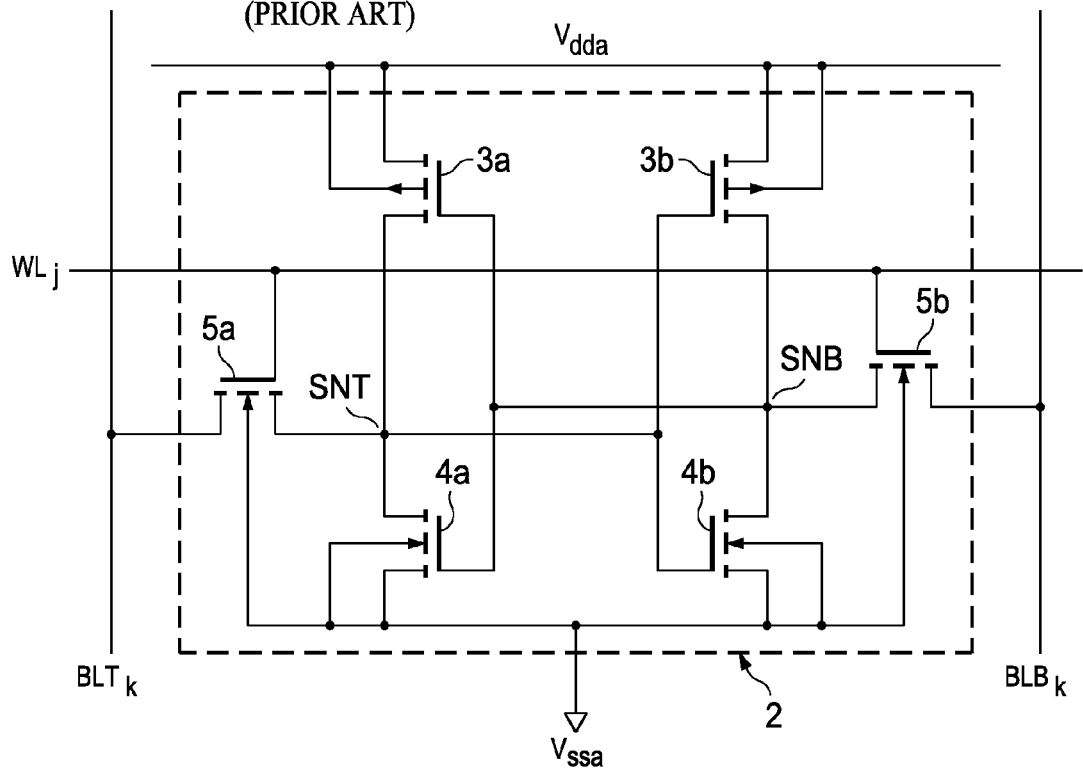
FIG. 1a is an electrical diagram, in schematic form, of a conventional six-transistor (6-T) static random access memory (SRAM) cell.

This invention will be described in connection with certain embodiments, namely as implemented into a method of testing static random access memories, because it is contemplated that this invention will be especially beneficial when used in such an application. However, it is also contemplated that this invention will also be beneficial if applied to memories of other types, and to stand-alone and embedded memories in integrated circuits of various architectures. Accordingly, it is to be understood that the following description is provided by way of example only, and is not intended to limit the true scope of this invention as claimed.

FIG. 2 illustrates an example of large-scale integrated circuit 20, in the form of a so-called "system-on-a-chip" ("SoC"), as now popular in many electronic systems. Integrated circuit 20 is a single-chip integrated circuit into which an entire computer architecture is realized. As such, in this example, integrated circuit 20 includes a central processing unit of microprocessor 22, which is connected to system bus SBUS. Various memory resources, including random access memory (RAM) 28 and read-only memory (ROM) 29, reside on system bus SBUS and are thus accessible to microprocessor 22. Typically, ROM 29 serves as program memory, storing the program instructions executable by microprocessor 22, while RAM 28 serves as data memory; in some cases, program instructions may reside in RAM 28 for recall and execution by microprocessor 22. Cache memory 26 (such as level 1, level 2, and level 3 caches, each typically implemented as SRAM) provides another memory resource, and resides within microprocessor 22 itself and therefore does not require bus access. Other system functions are shown, in a generic sense, in integrated circuit 20 by way of system control 24 and input/output interface 27.

Those skilled in the art having reference to this specification will recognize that integrated circuit 20 may include additional or alternative functions to those shown in FIG. 2, or may have its functions arranged according to a different architecture from that shown in FIG. 2. The architecture and functionality of integrated circuit 20 is thus provided only by way of example, and is not intended to limit the scope of this invention.

Figure 3:
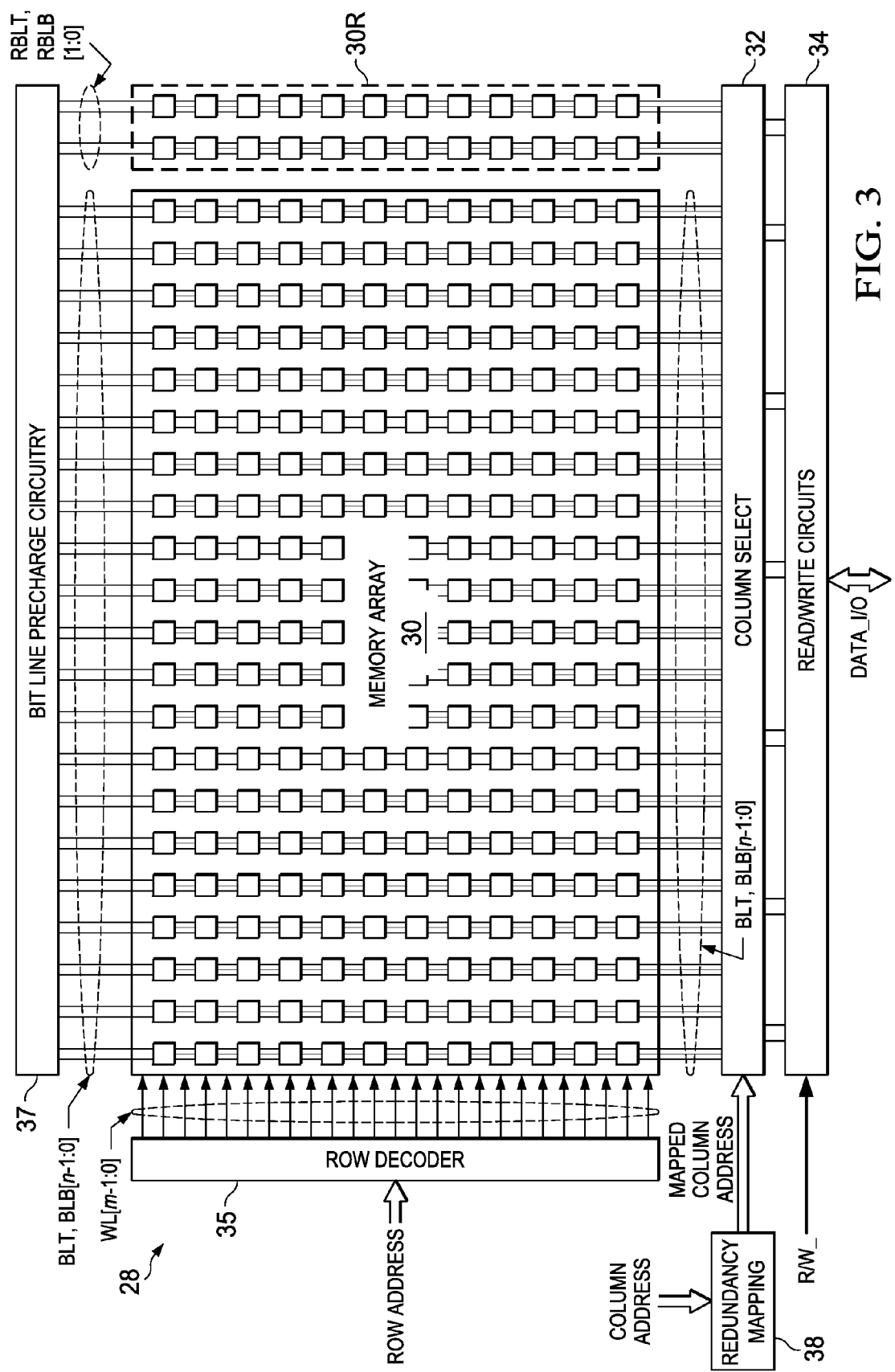
FIG. 3 is an electrical diagram, in block form, of a random access memory in the integrated circuit of FIG. 2, to which embodiments of the invention are applied.

Further detail in connection with the construction of RAM 28 in integrated circuit 20 is illustrated in FIG. 3. Of course, a similar construction may be used to realize other memory resources such as cache memory 26; further in the alternative, RAM 28 may correspond to a stand-alone memory integrated circuit (i.e., rather than as an embedded memory as shown in FIG. 2). Those skilled in the art having reference to this specification will comprehend that the memory architecture of RAM 28 in FIG. 3 is provided by way of example only.

In this example, RAM 28 includes many memory cells arranged in rows and columns within memory array 30. While a single instance of memory array 30 is shown in FIG. 3, it is to be understood that RAM 28 may include multiple memory arrays 30, each corresponding to a memory block within the address space of RAM 28. The construction of these memory cells according to embodiments of this invention will be described in further detail below. In this example, memory array 30 includes m rows and n columns of SRAM cells, with cells in the same column sharing a pair of bit lines BLT[n−1:0], BLB[n−1:0], and with memory cells in the same row sharing one of word lines WL[m−1:0]. Bit line precharge circuitry 37 is provided to apply a desired precharge voltage to the pairs of bit lines BLT[n−1:0], BLB[n−1:0] in advance of read and write operations. Row decoder 35 receives a row address value indicating the row of memory array 30 to be accessed, and energizes the one of word lines WL[m−1:0] corresponding to that row address value. Column select circuit 32 receives a column address value, and in response selects pairs of bit lines BLT[n−1:0], BLB[n−1:0] associated with one or more columns to be placed in communication with read/write circuits 34. Read/write circuits 34 are constructed in the conventional manner, for example to include the typical differential amplifier coupled to the bit lines for a column as selected by column select circuit 32 and a write circuit for selectively pulling toward ground one of the bit lines in the selected pair.

As is common in the art, redundant array 30R is provided in this example of RAM 28, to allow replacement of memory cells within array 30 that are found to be defective. In this example, redundant array 30R includes two columns of memory cells, associated with the appropriate one of bit line pairs RBLT, RBLB[1:0] connected to bit line precharge circuitry 37 on one side of redundant array 30R, and to column select circuit 32 on the other side. Each column of memory cells within redundant array 30R includes one memory cell in each of the rows within array 30, those cells receiving the same word lines WL[m−1:0] as cells within array 30 in the same rows. RAM 28 also includes redundancy mapping circuit 38, which provides mapping between a received memory address and a selected memory cell (i.e., row, column or both) within redundant array 30R, according to mapping indicated by fuses, programmed non-volatile register bits or memory cells, or the like within redundancy mapping circuit 38. As known in the art, the setting of such mapping in redundancy mapping circuit 38 is typically performed during the manufacturing test process, upon such testing identifying one or more defective or weak memory cells within array 30.

While RAM 28 includes two redundant columns of memory cells within redundant array 30R, more or fewer columns of memory cells may of course be provided within redundant array 30R. Alternatively, or in addition, to redundant columns, the architecture of RAM 28 may provide one or more redundant rows of memory cells. In the example of FIG. 3, redundant mapping circuit 38 is placed within RAM 28 within the path of the received column address, forwarding a re-mapped column address to column select circuit 32 when enabled. It is contemplated that redundant mapping circuitry 38 would of course be arranged to re-map row addresses, or both row and column addresses, depending on the arrangement of redundant array 30R. And while redundant mapping circuit 38 is shown as a separate function in the architecture of FIG. 3, it is contemplated that redundant mapping circuit 38 will typically be included or integrated within the address decoding circuitry of RAM 28 as appropriate for the arrangement of redundant array 30R.

As mentioned above, accelerated operating life tests of SRAM memory arrays have exhibited early life write failures in some memory cells. Those early life failures passed conventional manufacturing tests directed to evaluation of write margin, even with the application of worst case write bias conditions including guardbanding for degradation over time. As discussed above in connection with FIG. 1b, it has been observed, according to this invention, that memory cells with defects on the bit line side of the pass transistor can pass such conventional write margin screening, yet can still exhibit the early life write failure after even a modest degradation in transistor characteristics. One type of bit line side pass transistor defect has been observed to be the absence of a lightly-doped drain extension on the bit line side of the pass transistors (transistors 5a, 5b in FIG. 1b); other manufacturing defects can also cause this behavior.

As mentioned above in connection with FIG. 1c, conventional manufacturing test flows include the application of a static stress, for example by applying an elevated power supply voltage (e.g., $V_{dda}$ of FIGS. 1a and 1b) to the SRAM array. It has been observed, in connection with this invention, that this static stress has been ineffective to accelerate the early life failure mechanism caused by bit line side pass transistor defects described above. Instead, even with guardbanded write screen testing (process 18a of FIG. 1c), early life failures due to this defect have been observed.

Copending and commonly assigned application Ser. No. 13/220,104, filed Aug. 29, 2011, entitled "Method of Screening Static Random Access Memories for Pass Transistor Defects", incorporated herein by this reference, describes a method of screening static random access memory (SRAM) arrays to identify memory cells with bit line side pass transistor defects. According to this approach, a forward back-bias is applied to the load transistors of memory cells under test after a known data state has been written to those cells. A write of the opposite data state is then performed, followed by a read of the memory cells under test. The process is repeated for the opposite data state. Those memory cells that are not successfully written with the opposite data state after the forward back-bias are considered to have a defect at the bit line side of a pass transistor. This forward back-bias write screen has been observed to be effective in identifying SRAM memory cells with bit line side pass transistor defects by way of a time-zero electrical screen, and as such the early life mortality due to this type of defect has been observed to have been reduced. However, it has further been observed, in connection with this invention, that some number of early life write failures due to bit line side pass transistor defects still occur, even after screening by way of this forward back-bias write screen.

It is contemplated, according to this invention, that the early life failure mechanism caused by bit line side pass transistor defects is a shift in the electrical characteristics of the pass transistor due to channel hot carrier (CHC) conduction. More specifically, it is contemplated, according to this invention, that some number of carriers in the channel region of the defective pass transistor gain excess energy from the electric field in the channel, during early life operation of the memory. When in sufficient number, these channel hot carriers cause damage to the gate dielectric of the pass transistor, impairing the performance of the pass transistor and causing erroneous writes, as described above in connection with FIG. 1b. The LDD defect mentioned above, particularly when located on the bit line side of the pass transistors, is believed to increase the vertical electric field at the channel as compared with that of normal devices (i.e., without the defect). This increased vertical electric field increases the likelihood of channel hot carriers, and thus increases the likelihood and extent of CHC damage in the transistor.

Figure 1B:
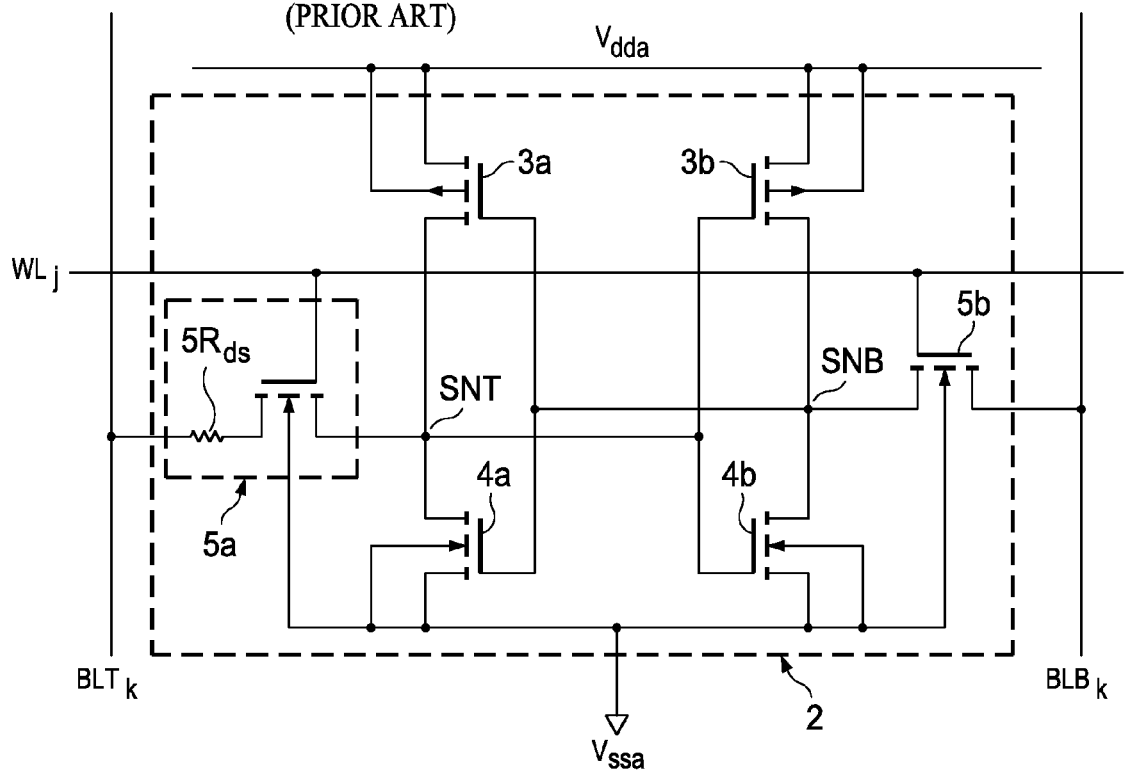
FIG. 1b is an electrical diagram, in schematic form, of the conventional SRAM cell of FIG. 1a illustrating the electrical effect of a bit line side defect at one of its pass transistors.
Figure 1C:
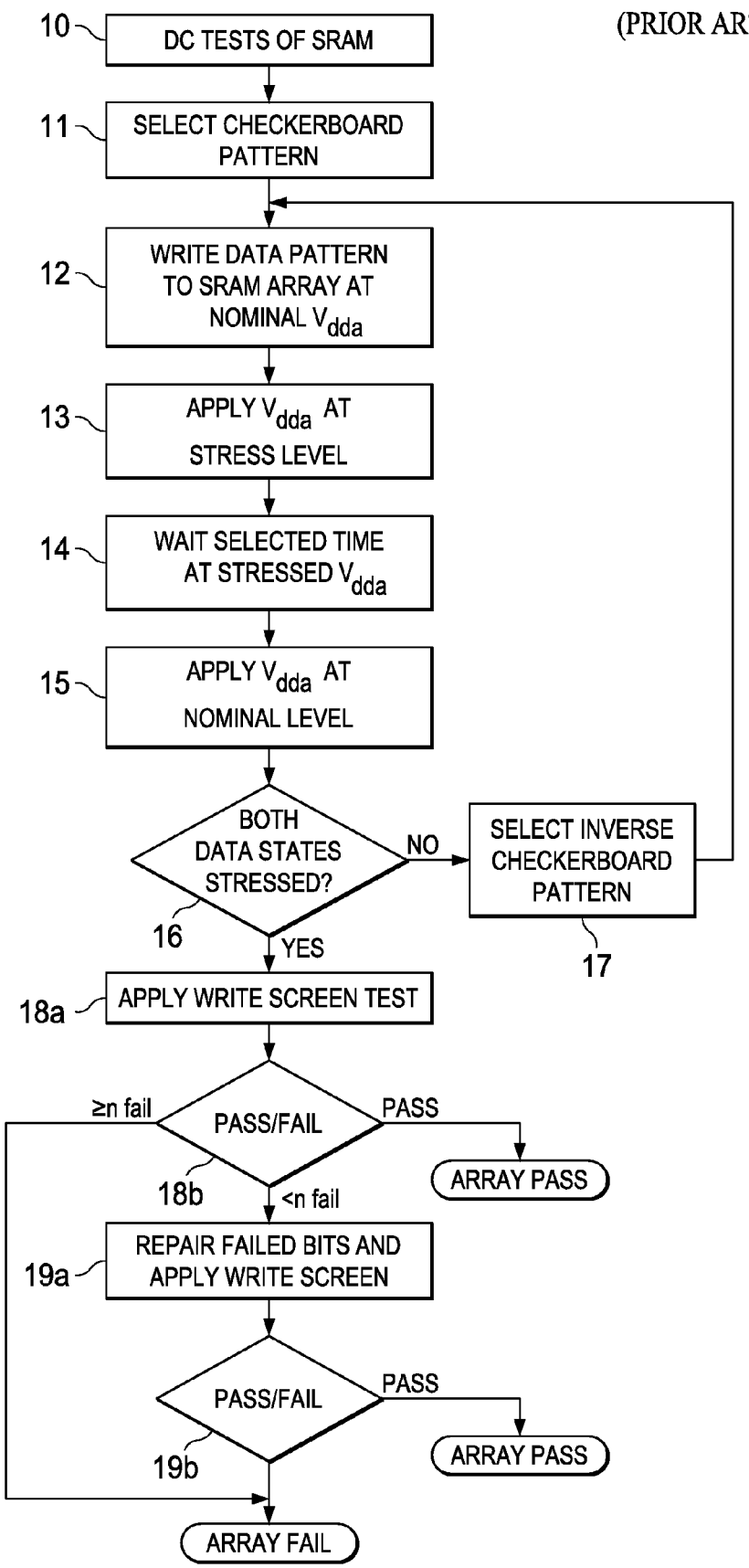
FIG. 1c is a flow diagram illustrating a conventional manufacturing test flow method for a memory array, including a static stress to accelerate early life failures.
Figure 4A:
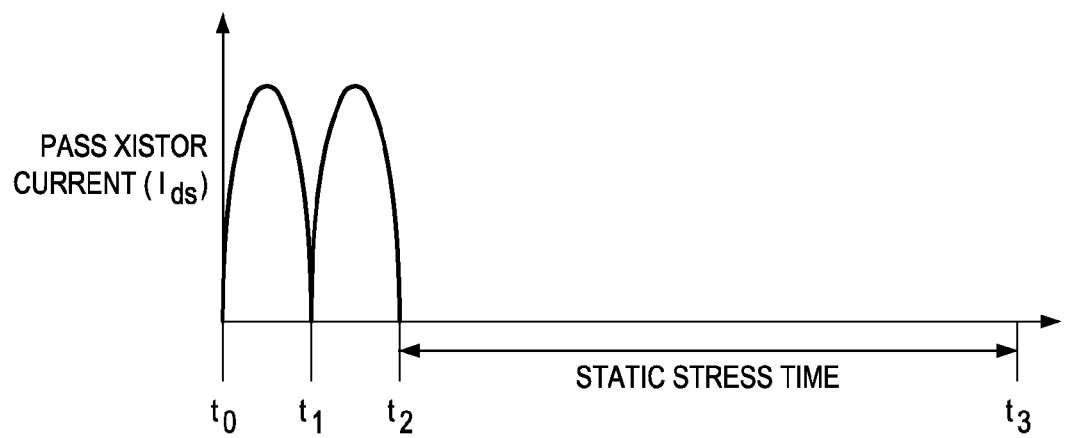
FIGS. 4a and 4b are plots illustrating source-drain current conduction through memory cell pass transistors over time, under a conventional static stress and under a dynamic stress according to embodiments of this invention, respectively.

It is surmised, in connection with this invention, that conventional static stress of the memory array as described above in connection with FIG. 1c is ineffective to accelerate this failure mechanism, because this static stress does not induce source-drain current flow in the pass transistors of any memory cell (e.g., pass transistors 5a, 5b of cell 2 of FIGS. 1a and 1b). Rather, the static stress on the $V_{dda}$ power supply merely increases the source-drain bias across the load and driver transistors of the SRAM cells, causing source-drain conduction in those devices but none in the pass transistors. This effect of the static stress on the source-drain current of pass transistors in an SRAM memory is illustrated in FIG. 4a, for the example of RAM 28 of FIG. 3 in the conventional manufacturing test flow of FIG. 1c. A pulse in the source-drain current $I_{ds}$ through the pass transistors of memory cells of array 30 occurs in checkerboard write process 12, as shown between time $t_0$ and time $t_1$ in FIG. 4a. The elevating of the power supply voltage $V_{dda}$ to stress levels, in process 13 of the conventional test flow, causes another pulse in the current $I_{ds}$ of the pass transistors of array 30, as shown in FIG. 4a between time $t_1$ and time $t_2$. But upon power supply voltage $V_{dda}$ reaching its elevated stress level, current $I_{ds}$ through the SRAM cell pass transistors stops. During the maintaining of this static stress level, for the selected duration of process 14 extending from time $t_2$ to time $t_3$ in the example of FIG. 4*a*, little or no source-drain current $I_{ds}$ is conducted through these pass transistors.

Figure 5:
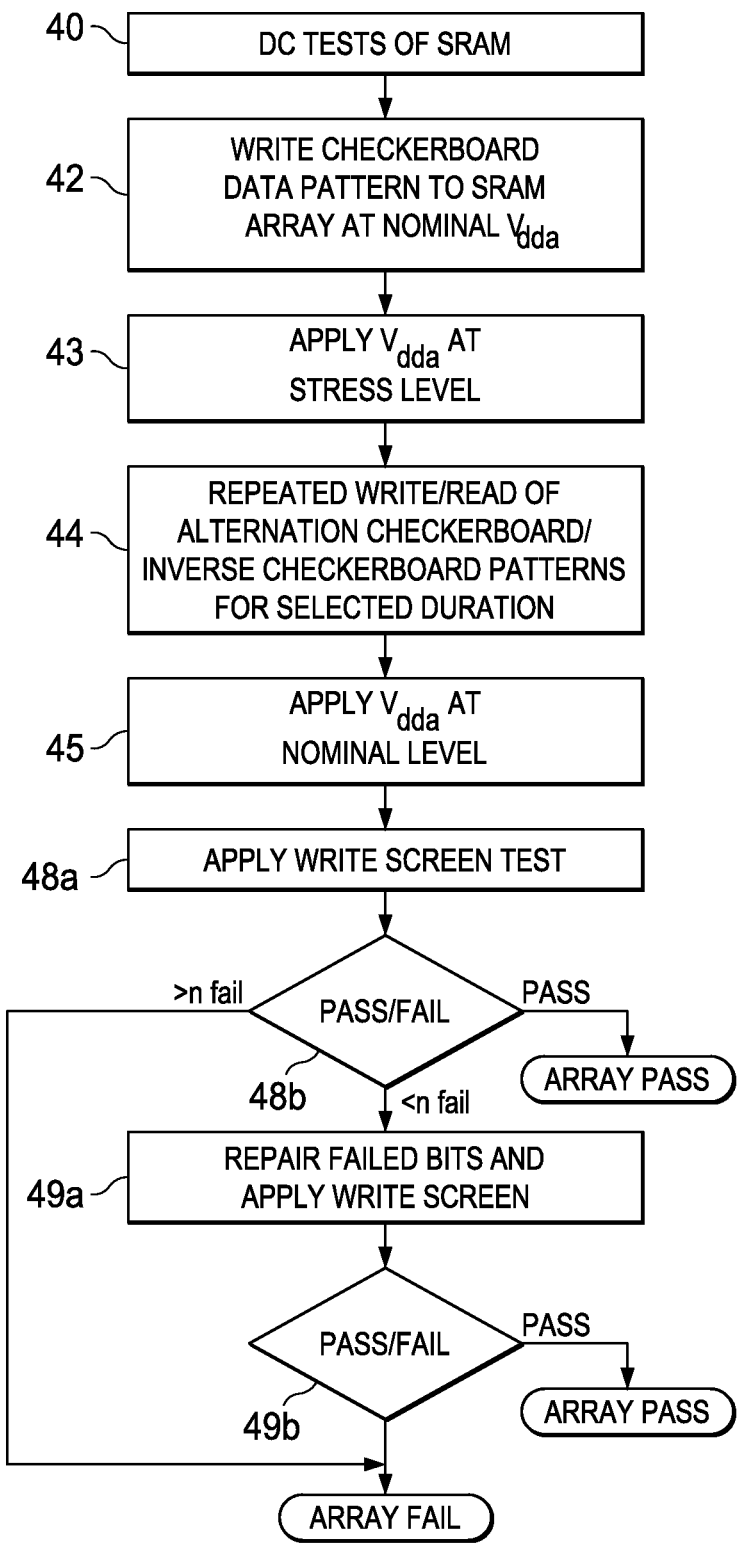
FIG. 5 is a manufacturing test flow diagram illustrating a method of applying a dynamic stress to the memory of FIG. 3, according to embodiments of the invention.

Referring now to FIG. 5, a method of stressing SRAM memory cells, in the context of a manufacturing test flow, in order to accelerate early life failures due to bit line side pass transistor defects, according to embodiments of this invention will now be described in detail. It is contemplated that this test flow of FIG. 5 may be performed at any stage in the manufacture of an integrated circuit including an SRAM array, including a large-scale SoC such as integrated circuit 20 of FIG. 2, or a stand-alone memory device, such as an integrated circuit including substantially the functions of RAM 28 of FIG. 3. Considering the ability to enable repair by way of redundancy, as will be described in connection with the test flow of FIG. 5, however, it is contemplated that this implementation is well-suited for manufacturing test of integrated circuits in wafer form (i.e., "multiprobe" functional testing). Of course, screening for early life failures according to embodiments of this invention may alternatively, or additionally, be performed at other stages in the manufacturing process, such as after packaging, system evaluation, and the like. The stress of embodiments of this invention may also be used in place of, or in addition to, a "burn-in" procedure. It is also contemplated that the test flow of FIG. 5 according to embodiments of this invention may be performed with the integrated circuits at any desired temperature (room temperature, or high or low temperature). Considering that the suspected failure mechanism accelerated by this test flow is due to channel hot carriers (CHC), it is contemplated that the stress of FIG. 5 would be best performed at whatever temperature is determined, for a given design and technology, as the worst case for CHC conduction, depending on the sensitivity of that mechanism to temperature during stress. In any case, it is contemplated that the stress and associated functional tests performed according to embodiments of this invention can be readily carried out by way of automated test equipment, in contact with the integrated circuits under test by way of conventional probes or contacts, as known in the art, such automated test equipment programmed to carry out the steps described herein. For purposes of this description, the memory under test will be referred to as RAM 28, including memory array 30 as described relative to FIG. 3, it being understood that the particular architecture of the memory under test can vary from that shown in FIG. 3. If array 30 of RAM 28 includes multiple "blocks", it is contemplated that the test flow of FIG. 5 can be applied sequentially to individual blocks, or to all blocks of multi-block array 30 simultaneously, or to some subset of those blocks at a time. The particular population of memory cells tested in a given pass of any or all of the processes of FIG. 5 can be selected by those skilled in the art having reference to this specification, for example to optimize test time.

The manufacturing test flow shown in FIG. 5 according to embodiments of the invention begins with process 40 in which conventional DC tests (e.g., leakage, power dissipation, etc.) are performed upon the memory under test. It is contemplated that functional tests may additionally be performed at this time, either prior to (or generally after) the DC tests of process 40. Upon the memory under test satisfying the DC tests of process 40 and any functional tests performed so far, a checkerboard data pattern (i.e., alternating "0" and "1" data states) is written into the memory cells in the array under test at a bias condition in which the power supply voltage $V_{dda}$ applied to the memory cells is at a nominal level (e.g., 1.2 volts) within the normal operating specifications for the memory, in process 42. Following the initial write of the checkerboard pattern, a stress bias condition is applied to the memory in process 43. It is contemplated that process 43 will typically be performed by increasing the power supply voltage $V_{dda}$ applied to the memory cells to an elevated level, for example to 1.8 volts for the case in which the nominal level of power supply voltage $V_{dda}$ is 1.2 volts. This elevated power supply voltage $V_{dda}$ appears at the load transistors of each cell in array 30; in addition, this higher voltage level may appear as or otherwise elevate the precharge voltage to bit lines in array 30, in some implementations.

Once the elevated stress bias is applied in process 43, dynamic stress process 44 is then performed upon RAM 28 under test. According to an embodiment of the invention, dynamic stress process 44 involves the repeated writing and reading of alternating data states to each memory cell in array 30. In this embodiment of the invention, since a checkerboard pattern is initially written to memory array 30 in process 42, dynamic stress process 44 repeatedly writes, and then reads, alternating checkerboard and inverse checkerboard (i.e., a cell-by-cell logical complement of the checkerboard pattern) data patterns into and from the memory cells of array 30 of RAM 28 under test. Of course, other data patterns than checkerboard/inverse checkerboard may alternatively be used. In any case, it is preferable, from the standpoint of stressing the memory cell pass transistors, that the data state of each memory cell under test be repeatedly changed during process 44.

The particular manner in which the alternating data patterns (e.g., checkerboard and inverse checkerboard) are written and then read can vary within process 44. For example, beginning with the initial condition of a checkerboard pattern, all cells of array 30 may be first written with the inverse checkerboard pattern in process 44, followed by a read of all cells of array 30 for this inverse checkerboard pattern, followed by a write of all cells of array 30 with the checkerboard, followed by a read of all cells of array 30 for the checkerboard. Alternatively, some subset of alternating reads and writes may be performed. For example, a first cell may be written to the data state for a given pattern, and then immediately read, followed by writing the opposite data state to a next adjacent memory cell, which is then immediately read, and so on; upon completion of the cell-by-cell write-read sequence, the entire memory array 30 will have the opposite data state from that which it stored before. In addition, the results of the read cycles need not be tested for accuracy, considering that accurate write, storage, and read operations may not always be successful or accurate in all memory cells at this elevated stress voltage (i.e., beyond the normal operating specifications). In addition, the peripheral circuitry involved in sensing and communicating the read data states may not be accurately operating at this stress bias level. As such, the read cycles need not actually sense, communicate, or compare the read data; rather, these "reads" may simply correspond to the execution of read cycles, selecting each of the memory cells under test, without regard to the actual results; for example, output buffers of the memory need not be enabled during these reads. Of course, if desired and if RAM 28 is operable, the read data states may be analyzed during dynamic stress process 44.

Figure 4B:
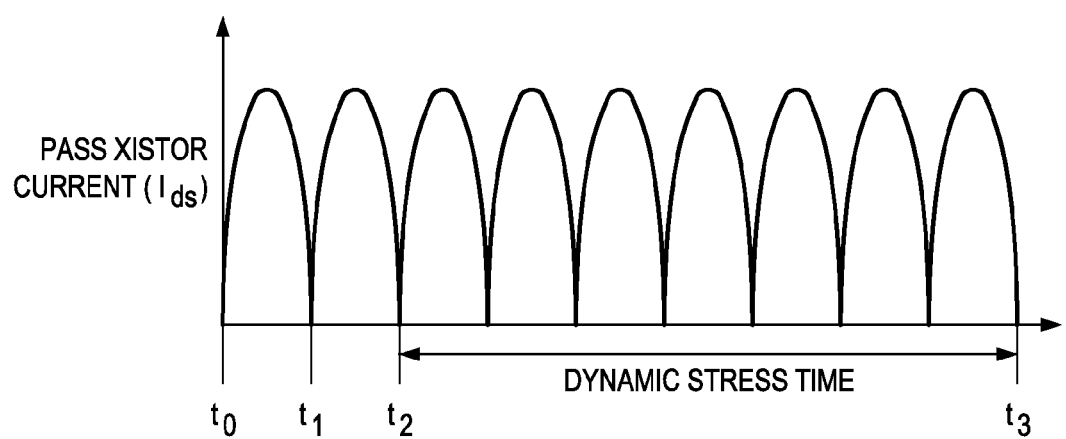

Process 44 continues for a selected duration, throughout which the alternating data state writes and reads continue for all memory cells in memory array 30. During this stress, memory cells in redundant array 30R (FIG. 3) are stressed in their powered-up states to the level of the applied power supply voltage $V_{dda}$. This dynamic operation, including writes and reads of opposite data states, is contemplated to cause source-drain conduction through the pass transistors of the memory cells of array 30 under test. FIG. 4b illustrates the expected source-drain conduction during this time, in a somewhat simplified manner. The interval from time $t_0$ to time $t_1$ of FIG. 4b shows the source-drain current $I_{ds}$ for the pass transistors of array 30 for the writing of the initial checkerboard pattern (process 42), and the interval from time $t_1$ to time $t_2$ shows the source-drain current $I_{ds}$ for those pass transistors during process 43, in which the elevated bias level of power supply voltage $V_{dda}$ is applied. According to this embodiment of the invention, however, significant source-drain current $I_{ds}$ through the memory cell pass transistors conducts during the dynamic stress interval from time $t_2$ to time $t_3$, as shown in FIG. 4b. This current through the pass transistors results from the current between each bit line and the corresponding storage node, in those memory cells that are in a selected row during a write or read access. Because each write cycle is writing the opposite data state in each cell from that which was previously stored, this pass transistor current $I_{ds}$ is conducted in each write cycle for at least one, if not both, storage nodes. Similarly, each read cycle causes pass transistor source-drain conduction between both storage nodes and their respective bit lines for memory cells in the selected row. This source-drain current level is also likely to be elevated from that occurring during normal operation, because of the higher bias level applied to the load transistors in each memory cell, and perhaps also if the bit line precharge voltage is increased from normal in this stress bias condition.

Upon completion of dynamic stress process 44 for the selected duration (e.g., three seconds), the reading and writing of data in RAM 28 stops. In process 45, the automated test equipment returns RAM 28 to a nominal bias condition, for example by reducing power supply voltage $V_{dda}$ to a nominal level (e.g., 1.2 volts, or another voltage within the normal operating specifications for RAM 28). After bias is returned to nominal in process 45, the memory cells of array 30 are tested by way of a write screen in process 48a. This write screen process 48a may be carried out in the conventional manner, for example as described above in connection with FIG. 1c. That conventional write screen test may be a guard-banded write margin test, by way of which those memory cells having a narrow write margin can be identified. It is contemplated that the dynamic stress of process 44 will cause some memory cells to fail this write screen test 48a that would not have failed in the absence of that dynamic stress.

According to an embodiment of the invention, write screen test 48a may be performed according to the method described in the above-incorporated application Ser. No. 13/220,104, which describes a method of screening SRAM memory cells for early life write failures due to bit line side pass transistor defects. These bit lines side pass transistor defects are contemplated to be the same defect as that for which dynamic stress process 44 is intended to accelerate failure. In this embodiment of the invention, as described the above-incorporated application Ser. No. 13/220,104, the memory cells must include a connection to the body node of certain transistors so that the back-bias can be modulated during the write screen test of process 48a. FIG. 6 illustrates the arrangement of memory cell $50_{jk}$ in array 30 (and redundant array 30R, as the case may be) in RAM 28. The construction and operation of memory cell $50_{jk}$ corresponds to that of a conventional six-transistor (6-T) static memory cell, for example as described above in connection with FIG. 1a. Alternatively, the memory cells of RAM 28 may be constructed in other arrangements, including other types of SRAM cells (8-T, 10-T, etc.), as a single-ended latch (i.e., a single inverter driving a bit line via a pass transistor), etc. In this case, memory cell $50_{jk}$ is constructed in the conventional manner as a pair of cross-coupled CMOS inverters, one inverter of series-connected p-channel MOS load transistor 53a and n-channel MOS driver transistor 54a, and the other inverter of series-connected p-channel MOS load transistor 53b and n-channel MOS transistor 54b, both inverters biased between power supply voltage $V_{dda}$ and reference (ground) voltage $V_{ssa}$. Similarly as described above, the gates of transistors 53a, 54a of one inverter are connected together and to the common drain node of transistors 53b, 54b in the other inverter, at storage node SNB; conversely, the gates of transistors 53b, 54b are connected together and to the common drain node of transistors 53a, 54a at storage node SNT. Cell $50_{jk}$ is in the $j^{th}$ row and $k^{th}$ column of memory array 30. As such, n-channel MOS pass-gate transistor 55a has its source/drain path connected between storage node SNT and bit line $BLT_k$ for the $k^{th}$ column, and n-channel MOS pass-gate transistor 55b has its source/drain path connected between storage node SNB and bit line $BLB_k$. The gates of pass-gate transistors 55a, 55b are driven by word line $WL_j$ for this $j^{th}$ row in which cell $50_{jk}$ resides.

In cell $50_{jk}$ as shown in FIG. 6, according to embodiments of this invention, the body nodes of p-channel transistors 53a, 53b are electrically connected to a separate voltage node $V_{nwell}$, rather than to power supply voltage $V_{dda}$. This separate electrical connection allows the body node voltage of these transistors 53a, 53b to differ from the voltage at the sources of transistors 53a, 53b (i.e., differ from power supply voltage $V_{dda}$). This ability to separately back-bias these p-channel MOS load transistors 53a, 53b is utilized in connection with embodiments of the invention, as will be described below.

As known in the art of conventional CMOS technology, MOS transistors are commonly formed within "wells", which are doped regions at the semiconducting surface of the wafer substrate into which transistors of the opposite conductivity type are formed. In a "single well" CMOS manufacturing process, transistors of one of the conductivity types are formed into the substrate itself, which is doped to a concentration (and conductivity type) appropriate for the forming of those transistors. In "twin-well" processes, p-channel transistors are formed into n-wells, and n-channel transistors are formed into p-wells. Electrical connection to the body node of those transistors formed in a well is typically made by way of a conductor in the integrated circuit in contact with a doped region at the surface of that well. The doped region (of same conductivity type as the well) provides an ohmic contact between the conductor and the well. For the example of cell $50_{jk}$ of FIG. 6, node $V_{nwell}$ is connected to the body nodes of transistors 53a, 53b by way of such an n-well contact. Similarly, the body nodes of n-channel transistors 54a, 54b, 55a, 55b are connected to ground voltage $V_{ssa}$ by way of a p-well contact.

Figure 7:
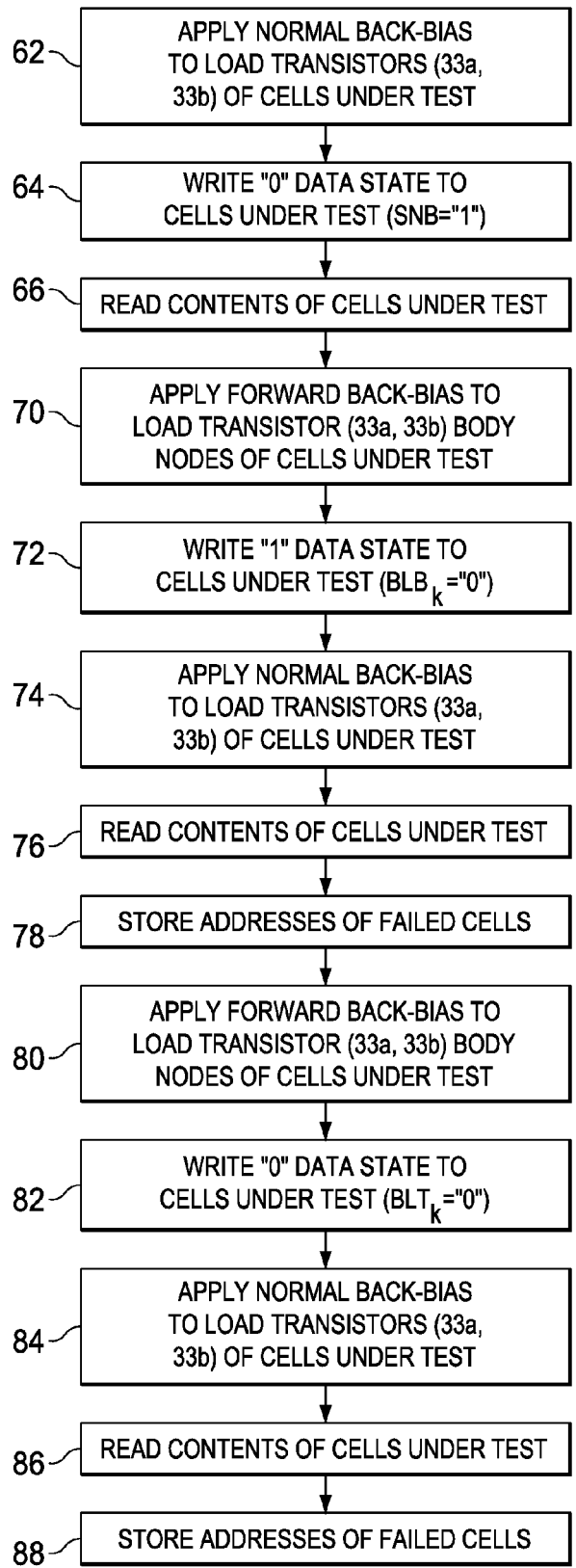
FIG. 7 is a flow diagram illustrating a write screen test in the test flow of FIG. 5, according to an embodiment of the invention.

An example of write screen process 48a according to this embodiment of the invention will now be described relative to FIG. 7. A more full description of this write screen, including redundancy repair within the test process itself, is described in the above-incorporated application Ser. No. 13/220,104, and may alternatively be used as process 48a et seq. The screening method of FIG. 7 begins with process 62, in which a normal back-bias is applied to the body nodes of the load transistors of cells 50 under test. Under this normal back-bias condition (also referred to as "zero back-bias"), the body node voltage is equal to the source node voltage for the load transistors. For cell $50_{jk}$ of FIG. 6, in which load transistors 53a, 53b are p-channel transistors, bias process 62 will apply power supply voltage $V_{dda}$ to the n-well of array 30 to establish this normal ("zero") back-bias condition. This back-bias condition is the same as that during normal operation of RAM 28. If normal back-bias has been applied to RAM 28 during functional testing performed prior to the portion of the manufacturing test shown in FIG. 7, process 62 may simply maintain that prior bias condition.

In process 64, the automated test equipment writes a "0" data state to each cell 50 under test. Due to bias process 62, the write cycles of process 64 are effectively normal write cycles such as performed in normal operation or conventional manufacturing test operations. For cell $50_{jk}$, this "0" data state corresponds to a "0" level at storage node SNT and thus a "1" data state at storage node SNB. In that data state, load transistor 53a and driver transistor 54b are both off, and load transistor 53b and driver transistor 53b are both on. In process 66, cells 50 under test are each read in the conventional manner, under the bias condition of process 62 (i.e., normal back-bias), to confirm that the correct "0" data state was successfully written and is being retained in each of those cells 50.

Process 70 is next performed, by way of which the load transistors in cells 50 under test are placed in a forward back-bias condition. For the case of p-channel load transistors, this forward back-bias condition corresponds to the body nodes being at a lower voltage than the source nodes in those load transistors. For the case of n-channel load transistors, this forward back-bias condition corresponds to the body nodes being at a higher voltage than the source nodes (typically at ground). In the example of cell $50_{jk}$ of FIG. 6, bias process 70 applies an n-well voltage that is below power supply voltage $V_{dda}$. This forward back-bias need not, and ought not, be of a magnitude greater than the turn-on voltage of the source junction in transistors 53a, 53b (e.g., 0.6 volts). For example, if power supply voltage $V_{dda}$ is at about 1.0 volts, an n-well voltage $V_{nwell}$ of about 0.90 volts may be applied in forward back-bias process 70.

Under this forward back-bias condition, the automated test equipment now writes the opposite "1" data state into each of cells 50 under test, in process 72. Other bias voltages applied during write process 72 may be at their normal write bias and logic levels. Alternatively, one or more guardband voltages may be applied in write process 72, for example, write voltages at a guardband level above ground may be applied to bit lines $BLT_k$, $BLB_k$, power supply voltage $V_{dda}$ may be reduced, etc.

The effect of bias process 70 on a cell 50 under test, which is storing the opposite data state, is to strengthen the drive of the one of load transistors 53a, 53b that is in its on state. Referring to FIG. 6, and as mentioned above, the stored "1" state in cell $50_{jk}$ is maintained by load transistor 53b in its on state; the forward back-bias of its body-to-source junction applied in process 70 serves to strengthen the drive of load transistor 53b, by effectively lowering its transistor threshold voltage. In this example, the write of a "1" data state to cell $50_{jk}$ is accomplished by the corresponding read/write circuit 34 (FIG. 3) driving a low logic level at bit line $BLB_k$ (with bit line $BLT_k$ not driven, and remaining at its precharged voltage), in combination with row decoder 35 energizing (i.e., driving to a high logic level) word line $WL_j$ for row j containing cell $50_{jk}$, which turns on pass transistors 55a, 55b. Typically, word line $WL_j$ will be energized after the driving of bit line $BLT_k$ or $BLB_k$, as the case may be, in the write cycle. This write of the "1" data state will trip the state of cell $50_{jk}$, so long as the drive of pass transistor 55b is sufficient to overcome the drive of load transistor 53b, as enhanced by the forward back-bias applied in process 70. It has been observed, according to this invention, that a sufficiently large defect on the bit line side of pass transistor 55b (as may have been accelerated by dynamic stress process 44) can inhibit pass transistor 55b from applying sufficient drive under this forward back-bias condition, in which case the write will fail (i.e., the voltage at storage node SNB of cell $50_{jk}$ does not reach the trip voltage).

Upon completion of write process 72 for all cells 50 under test, the automated test equipment can optionally return the body node bias of the load transistors in cells 50 under test to the normal back-bias (i.e., zero back-bias) condition, in process 74. Other bias voltages applied to array 20 can be changed in process 74 as well, so that RAM 28 is placed in a normal or nominal operating bias condition. Alternatively, if the forward back-bias condition does not significantly affect the readability of cells 50, process 74 can be omitted to save test time. In process 76, the contents of cells 50 under test are read, specifically to determine whether each of those cells 50 was successfully written with a "1" data state in process 72 while under the forward back-bias applied in process 70. The memory addresses of any failing cells 50 identified in process 76 are stored in the memory of the automated test equipment, in process 78.

The read of process 76 confirms that the contents of cells 50 under test (other than the failed cells) store the "1" data state written in process 72. According to this embodiment of the invention, these cells 50 are then tested for writes to the opposite data state. In process 80, the automated test equipment again applies a forward back-bias at the body nodes of the load transistors in cells 50 under test, in similar manner and under similar bias conditions as applied in process 70. If normal back-bias process 74 was omitted, process 80 is not necessary. As before, the forward back-bias condition strengthens the drive of the one of load transistors 53a, 53b that is in its on state, by lowering its transistor threshold voltage. In this stage of the screen process, the stored "0" state in cell $50_{jk}$ is maintained by load transistor 53a in its on state, while load transistor 53b is turned off in this data state.

In process 82, with cells 50 under test in this forward back-bias condition, the automated test equipment writes the "0" data state to each of cells 50 under test. In this example, the write of a "0" data state to cell $50_{jk}$ is accomplished by a low logic level driven at bit line $BLT_k$, in combination with word line $WL_j$ for row j driven high to turn on pass transistors 55a, 55b. For the writing of this "0" data state in process 82, bit line $BLB_k$ remains at its precharged voltage. For the write of this "0" data state to trip the state of cell $50_{jk}$, the drive of pass transistor 55a must overcome the drive of load transistor 53a, as enhanced by the forward back-bias condition applied in process 80 (or as applied in process 70 if normal back-bias process 74 is omitted). A bit line side defect in pass transistor 55a will inhibit the write of the "0" data state under these conditions.

In process 84, the automated test equipment returns the body node bias of the load transistors in cells 50 under test to the normal back-bias condition as in process 74. Alternatively, if it is contemplated that the forward back-bias condition does not degrade cell readability, process 84 can be omitted. In process 86, the contents of cells 50 under test are read, specifically to determine whether each of those cells 50 was successfully written with a "0" data state in process 82 despite the forward back-bias applied to the cell load transistors in process 80. The memory addresses of any cells 50 identified as failing the read of process 86 are stored in memory, in process 88.

As mentioned above, while it is contemplated that the write screen described in the above-incorporated application Ser. No. 13/220,104 optimizes the ability to screen bit line side pass transistor defects, other write screen test approaches may alternatively be used as process 48a. In process 48b, the results of write screen test 48a are analyzed. If all cells 50 passed write screen 48a after dynamic stress 44, array 30 is considered to have fully passed this stress and screen. If more memory cells 50 failed write screen 48a than can be successfully be repaired by redundant array 30R, then RAM 28 will be considered to have failed the stress and write screen.

If one or more bits of array 30, but fewer than the redundancy limit n, failed the stress and write screen of this test flow, the automated test equipment is operated to enable cells of redundant array 30R to replace those failing cells 50, in process 49a. Process 49a also performs the write screen test (i.e., as in process 48a) on those newly enabled redundant memory cells to ensure that none of those replacement cells are potential early life failures. If all of the enabled redundant cells meet the write screen of process 49a, array 30 is considered to have passed the stress and screen of this embodiment of the invention. However, if any of these redundant memory cells fail the write screen, RAM 28 is considered to have failed the stress and screen (no further redundancy being available to replace failed redundant cells).

According to embodiments of this invention, it is contemplated that memory cells containing latent bit line side pass transistor defect, and which cannot be identified as potential early life failures even by improved time-zero write screen tests such as described in the above-incorporated application Ser. No. 13/220,104, can have those defects accelerated by way of a dynamic stress, so as to become detectable at time zero by a write screen test. FIG. 8 plots the distribution of memory cells against a measure of the reliability of pass transistors in those memory cells, for example by way of a measure of the pass transistor resistance as described above in connection with FIG. 1b. In the plot of FIG. 8, memory cell reliability is less as one moves to the right along the plot. In this FIG. 8, the "bell curve" shape in the distribution corresponds to those memory cells that have no bit line side pass transistor defect; these memory cells present no early life failure risk for that type of defect. The identified portion of the plot along the right-hand side, labeled "detectable by write screen" indicate those memory cells that can be identified by a time-zero write screen, as described in connection with FIG. 7 or as described in the above-incorporated application Ser. No. 13/220,104, as having a bit line side pass transistor defect.

The memory cells within the central portion of the plot of FIG. 8, labeled as "shiftable by dynamic stress acceleration", represent those memory cells that have a bit line side pass transistor defect that is not sufficiently severe (e.g., not sufficiently resistive) to be detectable by the time-zero write screen described above in connection with FIG. 7 or in the above-incorporated application Ser. No. 13/220,104. The goal of the dynamic stress process according to embodiments of this invention is to accelerate the manifestation of the bit line side pass transistor defect in those cells, so that the defect becomes detectable by the time-zero write screen. In other words, the dynamic stress of embodiments of this invention "shift" the position of those memory cells in the distribution of FIG. 8 from the center portion of the distribution into the detectable portion of the distribution to the right. According to embodiments of this invention, however, it is contemplated that the dynamic stress will not degrade "good" memory cells that do not have the bit line side pass transistor defect, because those cells do not have a significant latent failure propensity that is accelerated by the dynamic stress.

It has been observed, in connection with this invention, that the dynamic stress according to embodiments of this invention also stresses many of those failure mechanisms that would be accelerated by the static stress in conventional test flows.

Examples of these failure mechanisms that are accelerated by the conventional static stress but also by the dynamic stress according to embodiments of this invention include failures due to high pass transistor threshold voltage, gate oxide integrity failures in the re-channel driver transistors, and diode leakage in the p-channel load transistors. Accordingly, it is contemplated that the static stress need not also be applied in addition to the dynamic stress, in most production test flows. Of course, the addition of the static stress into manufacturing test flows along with the dynamic stress is contemplated to be within the scope of this invention.

Various other alternatives to the particular stress and screen method of FIG. 5 will be apparent to those skilled in the art having reference to this specification. These alternatives include, among others, alternative data patterns (e.g., checkerboard, disturb patterns, etc.) that are applied to the cells under stress or test during this sequence, variations in the body node bias voltages to characterize or sort weak cells, and the like.

According to embodiments of this invention, the effect of bit line side defects in pass transistors of read/write memory cells can be successfully and efficiently screened during a manufacturing test. Such defective cells can thus be readily repaired by way of redundancy, if available, or the integrated circuit removed from the population. In addition, the screen according to embodiments of this invention has not been observed to over-screen memory cells and memories that do not have the defect, and as such does not result in undue yield loss.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of stress testing a solid-state static random access memory (SRAM) array comprised of a plurality of memory cells arranged in rows and columns, each memory cell comprised of first and second cross-coupled inverters and first and second pass transistors, each column of memory cells associated with a pair of bit lines coupled to the first and second pass transistors of the memory cells in the column, and each row of memory cells associated with a word line coupled to gates of the pass transistors of the memory cells in the row, the method comprising:

applying a nominal power supply voltage level to the array, the nominal power supply voltage level being within a normal operating range of the array;

then writing a first data pattern into a plurality of memory cells in the array;

then applying an elevated power supply voltage level outside of the normal operating range to the array;

during the step of applying the elevated power supply voltage level:

writing a second, complementary, data pattern to the plurality of memory cells;

selecting each of the plurality of memory cells in read cycles;

then writing the first data pattern to the plurality of memory cells;

selecting each of the plurality of memory cells in read cycles; and repeating the writing and selecting steps a plurality of times;

reducing the power supply voltage level to the array; and performing a write screen of the plurality of memory cells, the write screen comprising writing a data state into each of the plurality of memory cells following by reading the data state.

2. The method of claim 1, wherein the step of writing the first data pattern to the plurality of memory cells is performed upon all of the plurality of memory cells prior to the step of selecting each of the plurality of memory cells in read cycles;

and wherein the step of writing the second data pattern to the plurality of memory cells is performed upon all of the plurality of memory cells prior to the step of selecting each of the plurality of memory cells in read cycles.

3. The method of claim 1, wherein the steps of selecting each of the plurality of memory cells in read cycles are each performed, for each memory cell, after the step of writing to that memory cell, and prior to the step of writing to a next memory cell in the plurality of memory cells.

4. The method of claim 1, wherein the step of performing a write screen comprises, for each of the plurality of memory cells:

applying a forward back-bias voltage to load transistors of the cross-coupled inverters of each memory cell;

applying a voltage to the corresponding pair of bit lines and energizing the corresponding word line;

then de-energizing the word line; and then reading the memory cell.

5. The method of claim 4, further comprising:

after the de-energizing step and before the reading step, applying a normal back-bias voltage to the load transistors of the cross-coupled inverters.

6. The method of claim 1, wherein the first data pattern is a checkerboard pattern;

and wherein the second data pattern is an inverse checkerboard pattern.

7. The method of claim 1, further comprising:

responsive to the write screen identifying a memory cell as failed, storing the memory address of the memory cell.

8. The method of claim 7, wherein the array comprises a plurality of memory cells mapped to a memory address space, and further includes redundant memory cells;

and wherein the method further comprises:

after the step of storing the memory address of the memory cell, mapping the stored memory address to one of the redundant memory cells of the array.

9. The method of claim 1, wherein the array is in wafer form.

10. The method of claim 1, wherein the array is in the form of a packaged integrated circuit.

11. A method of stress testing a solid-state read/write memory comprised of a plurality of memory cells, each memory cell comprising a first inverter comprised of complementary load and driver transistors having their drains connected together at a first storage node and having their gates connected together, the load and driver transistors having source/drain paths connected in series between a power supply node and a reference node, each memory cell further comprising a first pass transistor having a source/drain path connected between the first storage node and a first bit line, and having a gate receiving a word line signal, the method comprising:

applying a nominal bias voltage to the power supply node;

then writing a first data pattern into the plurality of memory cells;

then increasing the voltage at the power supply node to a stress bias voltage;

while the voltage at the power supply node is at the stress bias voltage, repeatedly writing and reading a second data pattern and a first data pattern into the plurality of memory cells, the second data pattern being complementary to the first data pattern;

then decreasing the voltage at the power supply node from the stress bias voltage; and testing each of the plurality of memory cells by writing a data state into each of the plurality of memory cells following by reading the data state.

12. The method of claim 11, wherein the step of testing each of the plurality of memory cells comprises:

with the first storage node at a first logic level so that the load transistor of the first inverter is in an on state, applying a forward back-bias voltage to a load transistor of the first inverter;

then placing a second logic level at the first bit line and energizing the word line signal;

then de-energizing the word line signal;

then reading the memory cell.

13. The method of claim 12, further comprising:

after the de-energizing step, applying a normal back-bias voltage to the load transistor of the first inverter.

14. The method of claim 12, wherein the memory cell further comprises a second inverter comprised of complementary load and driver transistors having their drains connected together at a second storage node and to the gates of the first inverter, and having their gates connected together and to the first storage node, the memory cell further comprising a second pass transistor having a source/drain path connected between the second storage node and a second bit line, and having a gate receiving the word line signal;

wherein the method further comprises:

with the second storage node at the first logic level so that the load transistor of the second inverter is in an on state, applying a forward back-bias voltage to the load transistor of the second inverter;

then placing the second logic level at the second bit line and energizing the word line signal;

then de-energizing the word line signal;

then reading the memory cell.

15. The method of claim 11, wherein the first data pattern is a checkerboard pattern;

and wherein the second data pattern is an inverse checkerboard pattern.

16. The method of claim 11, further comprising:

responsive to the testing step determining that the read data state differs from the written data state for a memory cell, storing the memory address of the memory cell.

17. The method of claim 16, wherein the plurality of memory cells includes an array of memory cells corresponding to each address in a memory address space, and further includes redundant memory cells;

and wherein the method further comprises:

after the step of storing the memory address of the memory cell, mapping the stored memory address to one of the redundant memory cells of the array.

18. The method of claim 11, wherein the solid-state memory is realized within an integrated circuit in wafer form.

19. The method of claim 11, wherein the solid-state memory is realized within a packaged integrated circuit.

* * * * *